(12) United States Patent
Sin Yan Too et al.

(10) Patent No.: US 11,094,607 B2
(45) Date of Patent: Aug. 17, 2021

(54) HEATSINK RETAINER ASSEMBLY

(71) Applicant: Radian Thermal Products, Inc., Santa Clara, CA (US)

(72) Inventors: Thierry Sin Yan Too, San Ramon, CA (US); Andrew Richard Masto, San Jose, CA (US)

(73) Assignee: RADIAN THERMAL PRODUCTS, INC., Santa Clara, CA (US)

( * ) Notice: Subject to any disclaimer, the term of this patent is extended or adjusted under 35 U.S.C. 154(b) by 0 days.

(21) Appl. No.: 16/672,332

(22) Filed: Nov. 1, 2019

(65) Prior Publication Data

US 2020/0312744 A1 Oct. 1, 2020

Related U.S. Application Data

(60) Provisional application No. 62/826,837, filed on Mar. 29, 2019.

(51) Int. Cl.
*H01L 23/40* (2006.01)
*H05K 7/20* (2006.01)

(52) U.S. Cl.
CPC .......... *H01L 23/4093* (2013.01); *H01L 23/40* (2013.01); *H05K 7/20418* (2013.01); *H01L 2924/0002* (2013.01)

(58) Field of Classification Search
CPC ............. H01L 23/4093; H01L 23/4006; H01L 2023/4081; H01L 2023/4062; H01L 2023/405; H01L 23/3672; H01L 2023/4087; H01L 23/40; H01L 2924/0002; Y10T 24/44026; Y10T 29/49826; Y10T 29/49002; H05K 7/20436; H05K 7/20418; G06F 1/20; F21V 29/74

See application file for complete search history.

(56) References Cited

U.S. PATENT DOCUMENTS

| | | | |
|---|---|---|---|
| 6,331,937 B1 * | 12/2001 | Bartyzel | H01L 23/4093 257/718 |
| 7,167,370 B2 * | 1/2007 | Lee | H01L 23/4093 24/294 |
| 9,423,191 B2 | 8/2016 | Whitney et al. | |
| 10,557,493 B1 * | 2/2020 | Hibbs | F16B 5/0621 |
| 2005/0111192 A1 * | 5/2005 | Lee | H01L 23/4093 361/704 |

(Continued)

*Primary Examiner* — Adam B Dravininkas
(74) *Attorney, Agent, or Firm* — Womble Bond Dickinson (US) LLP

(57) ABSTRACT

A heatsink retainer assembly, and components of the heatsink retainer assembly, are described. The heatsink retainer assembly includes one or more heatsink anchors mounted on a heatsink retention wire between several stops. The anchors include channels to receive the retention wire such that the anchors can slide over the retention wire between the stops. The stops retain the anchors on the retention wire. The anchors can be inserted into respective mounting holes of a carrier substrate by pressing the anchors into the mounting holes on a side of the carrier substrate carrying a heat source. A heatsink can be mounted on the heat source and the retention wire can extend over the heatsink to retain the heatsink against the heat source when the anchors are secured to the carrier substrate. Other embodiments are described and claimed.

18 Claims, 9 Drawing Sheets

(56) References Cited

U.S. PATENT DOCUMENTS

2006/0114659 A1* 6/2006 Liang ................. H01L 23/4093
361/719
2008/0284005 A1* 11/2008 Wong ................. H01L 23/4093
257/727
2013/0094149 A1* 4/2013 Kataoka ............. H01L 23/4093
361/709

* cited by examiner

HEATSINK RETAINER ASSEMBLY

This application claims the benefit of U.S. Provisional Patent Application No. 62/826,837, filed on Mar. 29, 2019, which is incorporated herein by reference in its entirety to provide continuity of disclosure.

FIELD

The present disclosure relates to retention devices for heatsinks. More specifically, the present disclosure relates to retention devices for retaining heatsinks against electronic components mounted on a printed circuit board.

BACKGROUND INFORMATION

Printed circuit boards (PCBs) support and electrically connect electronic components of various types on a top side of the PCB. For example, passive electronic components such as resistors, inductors, or capacitors can be mounted on a PCB. Similarly, active electronic components such as integrated circuits can be mounted on the PCB. The electronic components generate heat during use, and the heat can be conducted and radiated away from the electronic components using a heatsink. For example, the heatsink can be mounted on an electronic component to transfer heat generated by the component into a surrounding environment. The heatsink may be retained against the electronic component by retention hardware, which maintains contact between the heat source and the heatsink.

A common form of retention hardware typically includes a clip portion that has a pair of couplings attached at respective ends of a wire. The couplings are end fittings, which are separate from the wire, and which are affixed to the ends of the wire, e.g., by a crimping process. Each end fitting can include a retention feature, such as a keyhole, that receives an end of a separate anchor component. The retention feature interferes with the end of the anchor to fasten the wire to the anchor. The anchors are inserted from a bottom side of the PCB through a mounting hole in the PCB to engage with the end fittings on the top side of the PCB.

SUMMARY

Existing retention hardware includes numerous parts that are small and difficult to assemble. In the example provided above, the end fittings must be installed on the wire to manufacture the clip portion, and the clip portion must subsequently be assembled to the separate anchor components to fasten the retention hardware to a printed circuit board (PCB). The anchor components are small, loose parts that can be fumbled or lost. Similarly, the end fittings are small and have retention features that require care and time to manually engage the ends of the anchors. Thus, not only are the individual components difficult to handle alone, but their size also complicates the act of attaching the components to each other. Notably, the difficulty in securing the end fittings to the anchors can create a hazard because the wire is placed under tension during installation, and if the end fitting-to-anchor attachment fails, or slips from the grip of the assembler or a tool used by the assembler, the wire can eject into a face of the assembler. Under these circumstances, the anchors can also dislodge from the PCB by falling out of the mounting hole due to the fact that the anchors are installed from the bottom side of the PCB. Additionally, given that the end fittings are fixedly mounted on the wire, the mounting holes must be accurately located below the end fittings for proper assembly. Thus, the PCB and the retention hardware must be designed to fit each other. For example, the mounting holes must be located in specific locations or else the anchor will not align with the end fitting during assembly. An assembler may attempt to bend the wire of the retention hardware to correct for any misalignment of the anchor, and in such case, the fit or function of the wire may be compromised. Additionally, any misalignment such as may result from design inaccuracy or manufacturing tolerance can exert a lateral load on the heatsink that misaligns the heatsink with the electronic component, resulting in degraded heatsink performance. Accordingly, existing retention hardware has numerous shortcomings, and there is a need for a heatsink retainer assembly to secure a heatsink to an electronic component, which is inexpensive to manufacture, easy to handle, and that can be easily and safely installed on a variety of PCB designs.

A heatsink retainer assembly, and components of the heatsink retainer assembly, are described. In an embodiment, a heatsink retainer assembly includes a heatsink retention wire and a heatsink anchor. The retention wire and the anchor are separate components that can be assembled. The retention wire can extend along a wire axis between a first wire end and a second wire end stop. The anchor can include a body that is mounted on the retention wire between the first wire end and the second wire end. More particularly, the anchor can have a body channel extending through the body, and the retention wire can be inserted through the body channel. The retention wire can include a first stop at the first wire end and a second stop at the second wire end. The wire can extend through the body channel such that the anchor is between the first stop and the second stop. In an aspect, the anchor is slidable along the retention wire. Accordingly, the anchor can be easily assembled to the wire, and easily positioned relative to mounting holes, by sliding the anchor over the wire.

The anchor can have several portions with various dimensions. For example, a barrel portion and a pin portion can extend along an anchor axis, and the barrel portion can be wider than the pin portion. Thus, when the pin portion is inserted into a hole in a carrier substrate, the barrel portion can be wide enough to reduce a likelihood that the entire anchor will slide through the hole.

To retain the anchor within the carrier substrate, the anchor can have one or more retention features. For example, the pin portion can extend from the barrel portion to a distal end of the body, and the retention feature(s) can be located at the distal end. Thus, when the pin portion is inserted into the hole in the carrier substrate, the retention feature(s) can advanced through the hole to catch on a bottom side of the carrier substrate. The retention feature(s) can resist backout of the anchor from the carrier substrate. In an aspect, the pin portion includes several prongs, and each prong has a respective retention feature, e.g., a respective barb. The prongs can be separated by a slot, and thus, the prongs can collapse radially to advance through the hole in the carrier substrate more easily. When passed through the hole, the prongs and/or barbs can deflect resiliently outward in a radial direction to grip the bottom side of the carrier substrate. Accordingly, the retention features can resist backout of the anchor from the carrier substrate.

In an embodiment, the anchor is a locking anchor. The anchor can have a body cavity extending along the anchor axis through the barrel portion and the pin portion from a proximal end of the body to the distal end of the body. The body cavity can receive a plunger. That is, the plunger can be disposed within the body cavity, and may be capable of moving axially along the anchor axis. The plunger can have a plunger channel extending through the plunger transverse to the anchor axis. For example, the plunger channel can be aligned with the body channel such that the retention wire extends through the channels in both the body and the plunger. In an aspect, the plunger can be advanced distally to transition the anchor to an unlocked state in which the retention features can collapse radially to allow the pin portion to be inserted or removed from the hole in the substrate. The plunger can be retracted proximally to transition the anchor to a locked state in which radial collapse of the retention features is resisted to cause the pin portion to lock into the carrier substrate.

In an embodiment, the plunger can be biased toward the locked state when the anchor is placed within the carrier substrate hole. A bias force may be provided by a resilience of the retention wire, e.g., by a tendency of the deformed retention wire to spring toward a neutral state when being held against a heatsink. Alternatively, the anchor can include a return spring between the plunger and the body, which biases the plunger. The bias force of the deformed retention wire or the return spring can act on the plunger to move the plunger proximally within the body from the unlocked state to the locked state.

In an embodiment, the first stop and the second stop of the retention wire retain the anchor on the wire. For example, the first stop and the second stop can be wider than the body channel. One or more of the stops can include a wire ring extending from the retention wire. The wire ring can have a loop, and the loop can extend over the retention wire such that a stop surface of the loop blocks the anchor from sliding onto the loop (and off of the retention wire). One or more of the stops can be a protrusion extending radially outward from the wire axis. For example, the stops can be deformed regions of the wire, e.g., staked sections, that have transverse dimensions large enough to catch on the barrel portion of the anchor and prevent separation of the anchor and retention wire. The assembled components are therefore less likely to be fumbled, lost, or inadvertently ejected into a face of an assembler.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1:
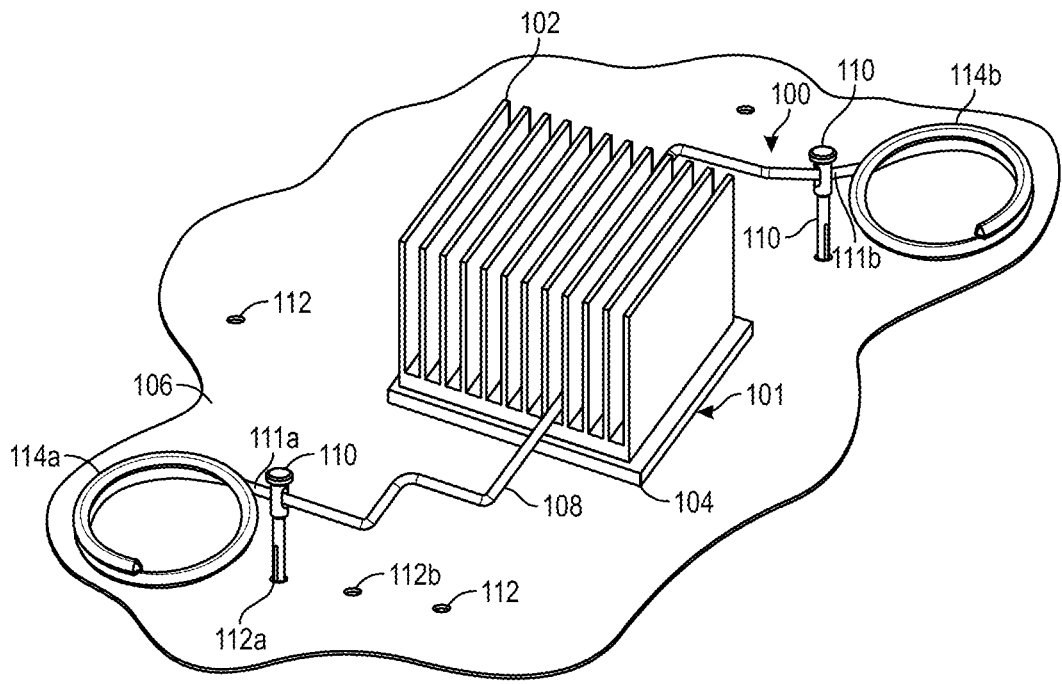
FIG. 1 is a perspective view of a heatsink retained against an electronic component by a heatsink retainer assembly, in accordance with an embodiment.

Embodiments describe a heatsink retainer assembly having one or more heatsink anchors mounted on a retention wire. The heatsink retainer assembly may be used to retain a heatsink against an integrated circuit mounted on a printed circuit board (PCB). The heatsink retainer assembly may also be used in other applications, such as to retain a heatsink against another heat source on or off of a PCB, and thus, reference to the heatsink retainer assembly as being used to retain a heatsink against an integrated circuit on a PCB is not limiting.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment," or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

The use of relative terms throughout the description may denote a relative position or direction. For example, "distal" may indicate a first direction along a longitudinal axis of a heatsink anchor. Similarly, "proximal" may indicate a second direction opposite to the first direction. Such terms are provided to establish relative frames of reference, however, and are not intended to limit the use or orientation of a heatsink retainer assembly or its components to a specific configuration described in the various embodiments below.

In an aspect, a heatsink retainer assembly for securing a heatsink to a heat source, e.g., an electronic component on a PCB, is provided. The heatsink retainer assembly can include one or more heatsink anchors that are mounted, e.g., slidably mounted, on a heatsink retention wire between several stops. The anchors are securely retained on the retention wire to prevent the anchors from being lost during assembly to the PCB. The anchors can be moved along the retention wire to align with mounting holes in the PCB. Accordingly, the heatsink retainer assembly reduces a risk of losing the retention hardware and accommodates a range of mounting hole locations and PCB designs. The heatsink retainer assembly does not require a separate end fitting, and thus, can be manufactured using low-cost manufacturing processes such as wire forming. In summary, the heatsink retainer assembly described below addresses the above-noted shortcomings of existing retention hardware.

Referring to FIG. 1, a perspective view of a heatsink retained against an electronic component by a heatsink retainer assembly is shown in accordance with an embodiment. The heatsink retainer assembly 100 can retain a heatsink 102 of a heatsink assembly 101. For example, the heatsink retainer assembly 100 can hold a heatsink 102 of the heatsink assembly 101, or another heat exchange device, against a heat source 104 of the heatsink assembly 101. The heat source 104 can, for example, be an electronic component mounted on a carrier substrate 106 of a PCB. For example, the heat source 104 can be an active electronic component such as an integrated circuit. Alternatively, the heat source 104 can be a passive electronic component. The heatsink 102 can be in direct contact with the heat source 104 and/or may be thermally coupled to the heat source 104 by a thermal interface material disposed between the heat source 104 and the heatsink 102.

The heatsink retainer assembly 100 can press on the heatsink 102 to hold the heatsink 102 against the heat source 104. In an embodiment, the heatsink retainer assembly 100 includes a heatsink retention wire 108 that extends over an upper surface of the heatsink 102 opposite of a lower surface that apposes the heat source 104. The heatsink retainer assembly 100 includes one or more heatsink anchors 110 mounted on the retention wire 108. For example, the first anchor 110 can be mounted on the retention wire 108 laterally outward from the heatsink 102 in a first direction (leftward from the heatsink 102 in FIG. 1), and a second anchor 110 can be mounted on the retention wire 108 laterally outward from the heatsink 102 in a second direction (rightward from the heatsink 102 in FIG. 1). The anchors 110 can engage respective holes 112 in the carrier substrate 106 to pull the retention wire 108 downward against the heatsink 102. More particularly, the retention wire 108 can extend from the first anchor 110 to the second anchor 110 across the top surface of the heatsink 102 (which may be between fins of the heatsink 102). The anchors 110 can hold the retention wire 108 at a vertical location that is below the top surface of the heatsink 102. Thus, the retention wire 108 can apply a downward force against the heatsink 102.

Accordingly, the heatsink retainer assembly 100 can secure the heatsink 102 to the heat source 104.

In an embodiment, the anchors 110 can freely move over the retention wire 108 such that the anchors 110 can engage any hole 112 that is below the retention wire 108 laterally outward from the heatsink 102. For example, while the retention wire 108 is pressing against the heat sink between the heatsink fins, as shown, the first anchor 110 can be pressed into a first hole 112a. Alternatively, the anchor 110 could be slid over the retention wire 108 in the rightward direction to align the anchor 110 with the nearby hole 112b. Accordingly, the movable anchors 110 allow the heatsink retainer assembly 100 to accommodate a variety of hole locations on the carrier substrate 106. The movable anchor 110 therefore allows heat sink assembly 100 to be installed without requiring holes 112 to be precisely located. Movable anchor 110 further provides the advantage of allowing a heatsink retainer assembly 100 of a particular dimension to be used in a plurality of assemblies where holes 112 may be located at different physical dimensions on the PCB.

An intermediate portion of the retention wire 108, which holds the anchors 110 and presses against the heatsink 102, can extend between end portions of the retention wire 108. Each end portion can include a stop 114 to limit movement of the anchors 110. More particularly, each anchor 110 can be slidably mounted on the retention wire 108 between a first stop 114a disposed at a first wire end 111a of the retention wire 108 and a second stop 114b disposed at a second wire end 111b of the retention wire 108. The stops 114 can have various embodiments, as described below. Each stop 114 can be configured to impede movement of the anchors 110 when the anchors 110 come in contact with the stops 114. The anchors 110 can be between the first stop 114a and the second stop 114b, and thus, the stops can obstruct movement of the anchors 110 beyond the intermediate portion of the retention wire 108 onto the end portions of the retention wire 108.

Figure 2:
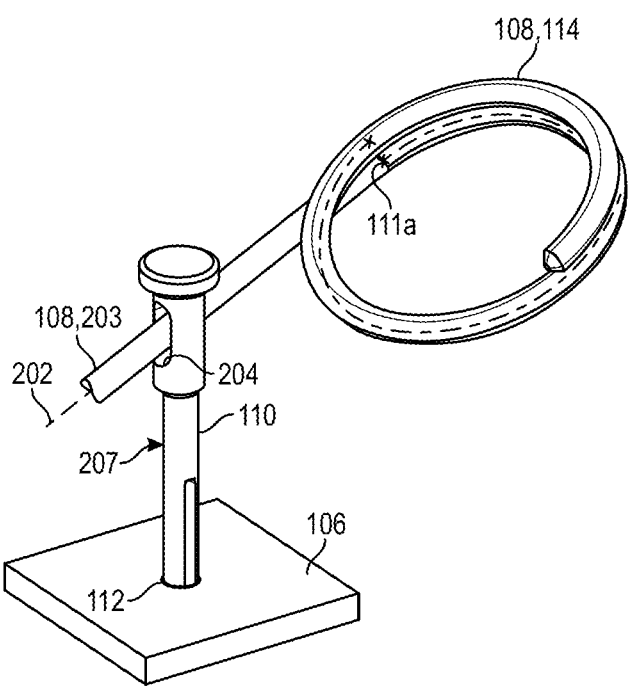
FIG. 2 is a perspective view of a heatsink anchor securing a heatsink retention wire to a carrier substrate, in accordance with an embodiment.

Referring to FIG. 2, a perspective view of a heatsink anchor securing a heatsink retention wire to a carrier substrate is shown in accordance with an embodiment. The retention wire 108 can extend along a wire axis 202 between the stops 114 of the heatsink retainer assembly 100. More particularly, an elongated body 203 of the retention wire 108 can extend along the wire axis 202 from the first wire end 111a of the elongated wire body 207 to the second wire end 11b of the elongated wire body 207. The wire axis 202 can extend between the first stop 114a disposed at the first wire end 111a and the second stop 114b disposed at the second wire end 111b along the elongated body 203 (the intermediate portion of the retention wire 108). As shown in FIG. 1, the elongated body 203 of the retention wire 108 can have one or more bends, and thus, the wire axis 202 can follow a straight and/or bent path between the stops 114.

In an embodiment, the anchor 110 has a body channel 204 that extends through a body 207 of the anchor 110 in a direction transverse to the longitudinal axis of the anchor 110. The body channel 204 can have a hole shape that is circular, rectangular, oval (as shown), or any other shape. In an embodiment, a height of the body channel 204 (in the longitudinal direction of the anchor 110) can be greater than a width of the body channel 204 (in a direction orthogonal to the longitudinal direction) to allow the retention wire 108 to tilt in an upward or downward direction within the body channel 204. The retention wire 108 can extend through the body channel 204 of the anchor 110 along the wire axis 202 parallel to a channel axis, or at a range of angles relative to the channel axis. Accordingly, the anchor 110 can be mounted on the retention wire 108, e.g., between the first stop 114a and the second stop 114b. The anchor 110 can be slidable along the wire axis 202 relative to the retention wire 108. Accordingly, the anchor 110 can be slid over the retention wire 108 during installation to align the anchor 110 with a hole 112 in the carrier substrate 106.

When the anchor 110 is inserted into the hole 112 in the carrier substrate 106, the retention wire 108 can be parallel (or at least not orthogonal to) a top surface of the carrier substrate 106. The anchor 110 can be pressed downward into the hole 112 during installation, as opposed to being inserted upward through the hole 112 from a bottom side of the carrier substrate 106. The ability to insert the anchors 110 into the holes 112 from the top side (or a same side as the heat source 104) of the carrier substrate 106 makes the assembly process easier and faster to perform because the assembler can see the insertion of the anchor tip into the hole 112 (as compared to trying to insert the anchor tip into the hole 112 from the bottom side that is not visible during assembly).

After inserting the anchor 110 into the hole 112 to secure the retention wire 108 above the carrier substrate 106 (and against the heat sink) there may still be some freedom of movement between the anchor 110 and the retention wire 108. For example, the body channel 204 allows the retention wire 108 to slide relative to the anchor 110 to settle into a lower stress state. This ability to shift slightly after installation provides for a self-aligning design because the retention wire 108 can move relative to the anchor 110 to reduce lateral bending in the heatsink retainer assembly 100 while maintaining downward pressure against the heatsink 102. The self-alignment functionality can facilitate accurate alignment between the heatsink 102 and the heat source 104, which can increase heat dissipation and improve heatsink performance as compared to a poorly aligned heatsink. As described above, such poor alignment can result when a wire is bent to clip a fixed end fitting onto a separate anchor component.

Figure 3:
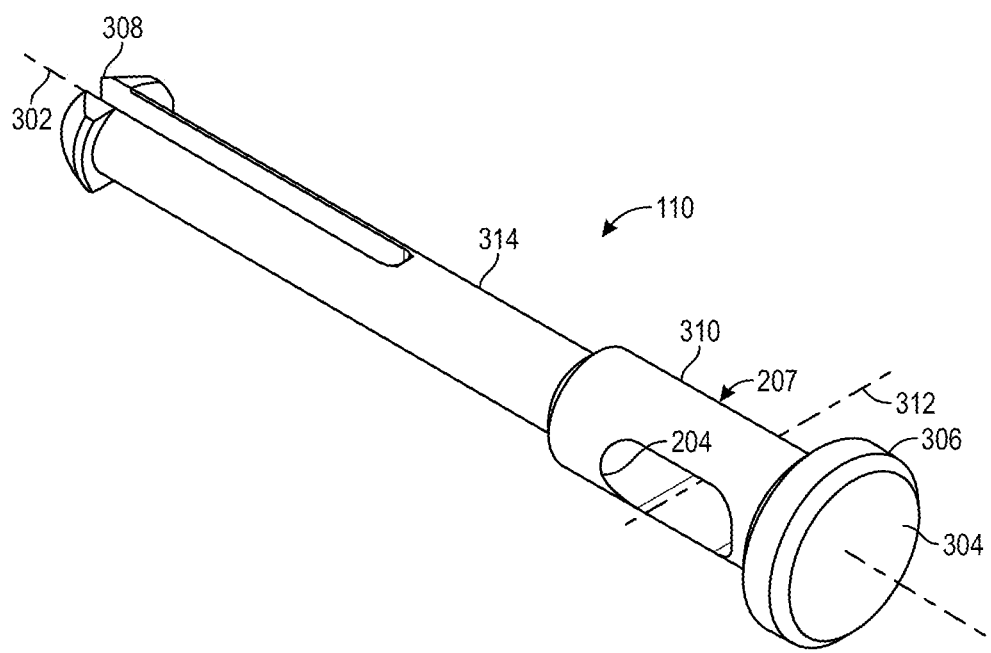
FIG. 3 is a perspective view of a heatsink anchor, in accordance with an embodiment.

Referring to FIG. 3, a perspective view of a heatsink anchor is shown in accordance with an embodiment. The anchor 110, which can be slidably retained on the retention wire 108 and can be installed from the top side of the PCB substrate, is described here in more detail. In an embodiment, the anchor 110 is a one-part anchor, which may be monolithically formed from a single piece of material, e.g., fabricated by machining or molding. The body 207 of the anchor 110 can include several portions. The body 207 and body 207 portions extend longitudinally along an anchor axis 302. The portions of the anchor 110 can be distributed along the anchor axis 302 in a particular arrangement relative to each other. Each portion can have a particular purpose and includes structure germane to that purpose, as described below.

Beginning at a proximal end 304 of the anchor 110, the body 207 includes a head portion 306. The head portion 306 can be cylindrical, e.g., having a diameter and a height. The head portion 306 may optionally extend from the proximal end 304 in a distal direction along the anchor axis 302. The proximal end 304 may be so-named because an assembler can press against the proximal end 304 to insert the anchor 110 into the target hole 112 in the carrier substrate 106. Thus, the head portion 306 can be nearer to the assembler than, for example, a distal end 308 of the anchor 110 opposite from the proximal end 304. The distal end 308 can insert into the hole 112 during assembly. The proximal end 304 of the anchor 110 can have a flattened surface, which may be wider than adjacent anchor portions, to facilitate comfortably pressing the head portion 306 when inserting the anchor 110 into the carrier substrate 106. More particularly, the head portion 306 of the anchor 110 can extend proximally from a barrel portion 310, and may be wider than the barrel portion 310 to make pressing the anchor 110 into place easier for the assembler.

The body 207 of the anchor 110 can include the barrel portion 310 extending along the anchor axis 302 in the distal direction from the head portion 306. The barrel portion can be cylindrical, e.g., having a diameter and a height. The barrel portion 310 can include the body channel 204 to receive the retention wire 108. The body channel 204 can extend through the barrel portion 310 along a channel axis 312 in a direction orthogonal, or approximately orthogonal, to the anchor axis 302. Accordingly, the anchor 110 can slide over the retention wire 108 in the direction, or approximately the direction, of the planar surface of the carrier substrate 106. The anchor 110 can also rotated about the retention wire 108 received within the body channel 204.

The body 207 of the anchor 110 may include a pin portion 314 extending from the barrel portion 310 in the distal direction along the anchor axis 302. More particularly, the pin portion 314 can extend from the barrel portion 310 to the distal end 308 of the body 207. The pin portion 314 can have a form of a slotted cylinder, e.g., having a diameter and a height one or more longitudinal slots extending over a portion of the height. The pin portion 314 can be configured to insert through the hole 112 in the carrier substrate 106. For example, the pin portion 314 can have a transverse dimension that is smaller than a diameter of the hole 112.

Figure 4:
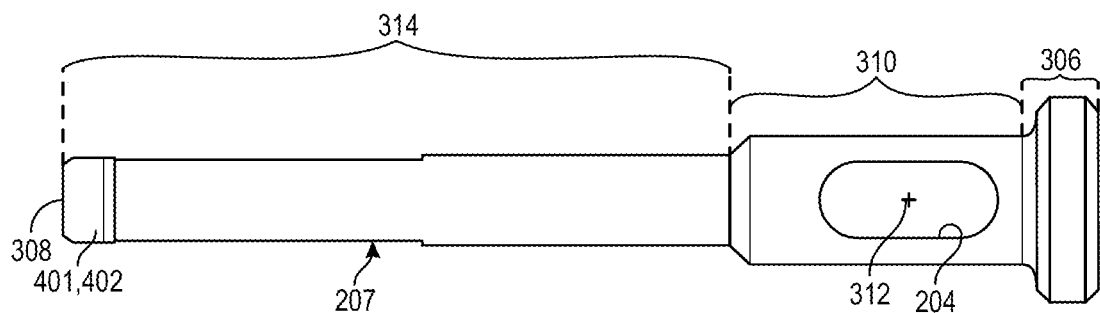
FIGS. 4-5 are side views of a heatsink anchor, in accordance with an embodiment.

Referring to FIG. 4, a side view of a heatsink anchor is shown in accordance with an embodiment. The barrel portion 310 can be wider than the pin portion 314. For example, a transverse dimension of the barrel portion 310 may be greater than the transverse dimension of the pin portion 314. The increased barrel portion width allows for the body channel 204 to be wider than the retention wire 108. Optionally, the barrel portion 310 can have a transverse dimension larger than the diameter of hole 112 that the pin portion 314 is inserted into, and thus, the barrel portion may interfere with the top surface of the carrier substrate 106 if the anchor 110 is pressed downward far enough. It will be appreciated, however, that the pin portion 314 need not be inserted to a distance where the barrel would interfere with the top surface of the carrier substrate 106. For example, the pin portion 314 may only be inserted into the hole 112 to a depth that allows features of the pin portion 314 to engage the carrier substrate 106.

In an embodiment, the anchor 110 includes one or more retention features 401 at the distal end 308. Each of the one or more retention features 401 can engage the carrier substrate 106 and fasten the anchor 110 to the carrier substrate 106. For example, the one or more retention features 401 can be at the distal end 308 of the pin portion 314, and can engage an inner wall of the hole 112 that extends through the carrier substrate 106. Non-limiting examples of such retention features 401 includes knurled surfaces, threads, bristles, or other surface characteristics or surface extensions that can press against the inner wall. The roughened surface of the retention feature 401 and/or a radial protrusion of the retention feature 401 can increase friction between the pin portion 314 and the carrier substrate 106 to resist relative movement therebetween.

The one or more retention features 401 of the pin portion 314 may include features to engage the bottom side of the carrier substrate 106 after inserting the anchor 110 into the hole 112. In an embodiment, the anchor 110 includes one or more radial protrusions at the distal end 308. For example, the radial protrusions may be one or more barbs 402. The barbs 402 can extend radially outward from an outer surface of the pin portion 314. In an embodiment, the barbs 402 can have flattened sidewalls such that a transverse dimension of the barbs 402 is substantially equal to the transverse dimension of the pin portion 314 in at least one side view (e.g., FIG. 4). It will be appreciated that other radial protrusions may include features other than barbs 402, such as a detent, a radially extending filament or bristle, or any other feature having an outer diameter that is greater than the hole 112 diameter. Accordingly, after being inserted through the hole 112, the increased radial dimension of the retention feature 401 can interfere with the bottom surface of the carrier substrate 106 to resist withdrawal through the hole 112.

Figure 5:
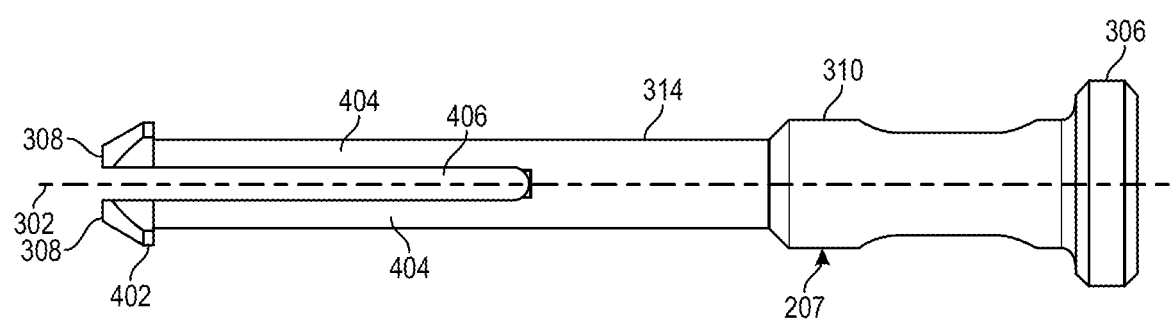

Referring to FIG. 5, a side view of a heatsink anchor is shown in accordance with an embodiment. A transverse dimension of the barbs 402 in at least one side view (e.g., FIG. 5) may be greater than the transverse dimension of the pin portion 314. For example, each barb 402 can have a sloping distal surface that extends radially outward at an angle from the distal end 308 of the anchor 110 to an apex of the barb 402. The apex of the barb 402 may be a radially outward edge of a ledge formed where a proximal face of the barb 402 extends in the transverse direction to an outer surface of the pin portion 314. The barbs 402 can be wider than the pin portion 314 that remains within the hole 112 of the carrier substrate 106 after installation. Given that the barbs 402 are wider than the pin portion 314, a wide range of hole dimensions and carrier substrate thicknesses can be accommodated. For example, the anchor 110 can be inserted into any of the holes 112 that have a diameter that is between a transverse dimension of the barbs 402 and a transverse dimension of the pin portion 314 proximal to the barbs 402.

In an embodiment, the pin portion 314 includes several, e.g., a plurality of, prongs 404 extending from the barrel portion 310 to the distal end 308. For example, one or more slots 406 in the pin portion 314 can separate and define the prongs 404. Each slot 406 can extend along the anchor axis 302 between two or more of the prongs 404 to provide a space, radially inward from the prongs 404, that the prongs 404 can deflect into. As shown in FIGS. 3-5, each prong 404 can have a semicircular cross-section, and can extend from a proximal subportion of the pin portion 314, which has a circular cross-section. The prong cross-sections may be thirds of a circle in the case of three prongs, or quarter circles in the case of four prongs. The prongs 404 are part of a distal subportion of the pin portion 314.

Each prong 404 can extend to the distal end 308, and thus, each prong 404 can have a respective retention feature 401, e.g., a radial protrusion such as a barb 402 or a bulge. In an aspect, each prong 404 can have a respective one of the one or more retention features 401. A width of the slot 406 separating two prongs 404 can be equal to or greater than a total of the radial dimensions of the ledges of the separated prongs 404. Accordingly, when the anchor 110 is inserted into the hole 112 in the carrier substrate 106, the distal sloping faces of the barbs 402 can be deflected inward by an edge of the hole 112 and the slot width can decrease. The outward edges of the prongs 404 can also move radially inward until the edges are within the hole 112, and the pin portion 314 can advance through the hole 112.

The anchor structure described above allows the anchor 110 to be installed from the top side of the carrier substrate 106, which can make assembly easier than inserting an anchor 110 from the bottom side. When the barbs 402 pass through the hole 112 and the ledge is located distal to the bottom surface of the carrier substrate 106 (or a same side as the heat source 104), the prongs 404 can return resiliently outward to the undeflected state shown in FIG. 5. In the undeflected state, the pin portion 314 can reside within the hole 112. An upward force, e.g., exerted on the anchor 110 by the retention wire 108, can pull the ledges of the barbs 402 against the bottom surface of the carrier substrate 106. The proximal ledges of the barbs 402 interfere with the bottom surface to retain the heatsink retainer assembly 100 relative to the carrier substrate 106.

The anchor 110 can be removed from the carrier substrate 106 after installation if needed, e.g., to rework the circuit board, to exchange the heatsink 102, or for another reason. The anchor 110 can be disengaged from the carrier substrate 106 by pinching the barbs 402 radially inward until a transverse dimension of the barbs 402 is less than the diameter of the hole 112. The anchor 110 may alternatively be disengaged from the carrier substrate 106 by pinching the prongs 404 radially inward until a transverse dimension of the barbs 402 is less than the diameter of the hole 112. The barbs 402 can then be pushed or pulled upward through the hole 112 to detach the anchor 110 from the carrier substrate 106.

Figure 6:
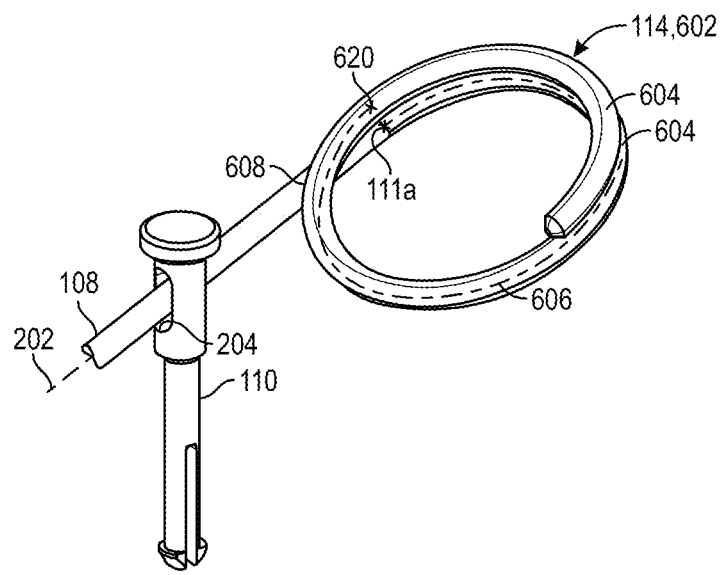
FIG. 6 is a perspective view of a heatsink anchor slidably mounted on a heatsink retention wire having a wire ring stop, in accordance with an embodiment.

Referring to FIG. 6, a perspective view of a heatsink anchor slidably mounted on a heatsink retention wire having a wire ring stop is shown in accordance with an embodiment. As described above, a transverse dimension of the elongated retention wire 108 can be less than a size of the body channel 204 to allow the anchor 110 to slide along and rotate about the wire. In contrast, each stop 114, e.g., the first stop 114a and the second stop 114b, may be wider than the elongated wire member. More particularly, each of the stops 114 of the heatsink retainer assembly 100 may be wider than the body channel 204. The increased dimension of the stops 114 retain the anchor 110 on the intermediate portion of the retention wire 108 between the stops 114. The stops 114 can be integrally formed with the retention wire 108, or the stops 114 may be separate components mounted on the retention wire 108.

In an embodiment, one or more of the stops 114 include a wire ring 602 extending from the intermediate portion of the retention wire 108. The wire ring 602 can have one or more loops 604. For example, the wire ring 602 can have a shape of a circle cotter or a kickout ring. Each loop 604 of the ring can extend about a respective turn axis 606. As shown in FIG. 6, a first loop 604 of the wire ring 602 extends from the first wire end 111a at an end of the straight intermediate section of the retention wire 108 to a second end 620 of the loop 604 vertically above the first wire end 111a. Another loop 604 extends from the second end 620, and in the example of FIG. 6, continues for a half turn to an end of the wire ring 602. It may be desirable for the wire ring 602 to have more than one and a half loops 604, e.g., two or more loops 604.

The loops 604 of the wire ring 602 extend over the intermediate portion of retention wire 108 in the region where the straightened segment of the retention wire 108 and the wire ring 602 overlap. At the overlapping segment, a stop surface 608 of the loop 604 blocks the anchor 110 from sliding onto the loop 604. By way of example, the wire ring 602 acts like a split ring used to hold keys, and the anchor 110 cannot slide onto the wire ring 602 without an assembler forcefully moving the anchor 110. In normal use, the anchor 110 slides on the straightened segment, however, it does not slide beyond the stop surface 608. Accordingly, the anchor 110 is retained on the segment of the retention wire 108 between the first stop 114 and the second stop 114.

Advantageously, the wire ring 602 can be integrally formed with the intermediate segment of the retention wire 108 between the first stop 114 and the second stop 114. More particularly, the loops 604 of the wire ring 602 can be formed by a wire forming machine. Wire forming is an inexpensive process compared to, for example, die casting separate end fittings that are individually attached to a wire. Accordingly, the wire ring 602 provides an inexpensive stop 114 that retains the anchor 110 on the retention wire 108 and allows the anchor 110 to slide freely to accommodate a wide variety of hole locations in the carrier substrate 106, without a risk of losing the anchor 110.

Figure 7:
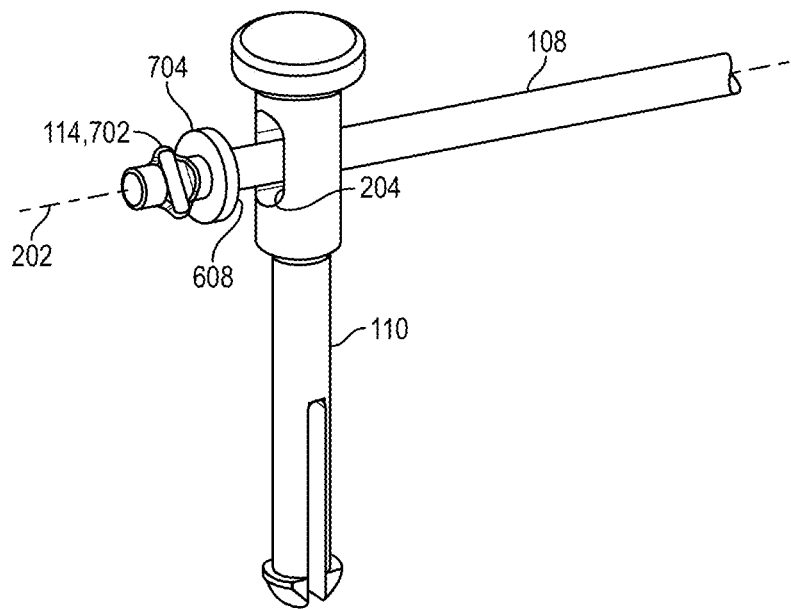
FIG. 7 is a perspective view of a heatsink anchor slidably mounted on a heatsink retention wire having a protrusion stop, in accordance with an embodiment.

Referring to FIG. 7, a perspective view of a heatsink anchor slidably mounted on a heatsink retention wire having a protrusion stop is shown in accordance with an embodiment. One or more of the stops 114 of the heatsink retainer assembly 100 can be integrally formed with the intermediate portion of the retention wire 108 by deforming the elongated retention wire 108 to increase a transverse dimension of the wire at a stop 114 location. For example, one or more of the first stop 114 or the second stop 114 can include a protrusion 702 extending radially outward from the wire axis 202. In an embodiment, the protrusion 702 is formed by staking or otherwise shaping the retention wire 108 to locally expand the wire such that the transverse dimension of the protrusion 702 is greater than the size of the body channel 204. Accordingly, the protrusion 702 can provide the stop surface 608 to retain the anchor 110 on the retention wire 108.

An intermediate stop component can be mounted on the retention wire 108 between the stop 114 and the anchor 110. For example, a collar 704 having an annular disk shape can be placed on the retention wire 108 prior to forming the protrusion 702. The collar 704 can have an inner diameter that is less than the transverse dimension of the protrusion 702 such that the stop 114 retains the collar 704 on the retention wire 108. The collar 704 can have an outer diameter that is greater than the size of the body channel 204 such that a face of the collar 704 between the inner and outer diameters interferes with an outer surface of the barrel portion 310 around the body channel 204 to retain the anchor 110 on the retention wire 108. An advantage of the protrusion 702 and/or intermediate stop embodiments described above is the compactness of such a design. More particularly, forming or mounting the protrusion 702 or the collar 704 at an end of the straightened segment of the retention wire 108 can require less space than, e.g., wire forming the loop structures of the wire ring 602. Nonetheless, there may be trade-offs in terms of material and/or manufacturing costs for each of these embodiments, and thus, one skilled in the art can employ these or similar embodiments to provide the heatsink retainer assembly 100.

The stops 114 of the heatsink retainer assembly 100 can be formed or provided in numerous other manners. By way of example, a Tinnerman nut can be mounted on the retention wire 108 to act as the stop 114 for the anchor 110. Alternatively, a spot weld, a solder bead, or another diametric enlargement can be added to the retention wire 108 (rather than deforming the wire) to provide the protrusion 702. Accordingly, the stop embodiments described herein are provided by way of example and not limitation. Functionally equivalent embodiments may be contemplated by one skilled in the art in accordance with this description.

A method of assembling the heatsink retainer assembly 100 is provided. In an operation, the anchor 110 is inserted onto an end of the retention wire 108 and slid over the straight intermediate portion of the retention wire 108. In the case of the retention wire 108 having a wire ring 602, the loop 604 of the wire ring 602 can be inserted into the body channel 204, and the anchor 110 can be slid over the wire ring 602 until it is placed over the straight segment. This assembly process can be compared to the process of inserting a key onto a key ring.

In an embodiment, the anchor 110 is slid onto the straight intermediate portion of the retention wire 108 prior to forming the stop 114. For example, the retention wire 108 can have a straight segment that is inserted into the body channel 204 of the anchor 110. The anchor 110 can be moved inward over the wire to expose an end region of the wire. Similarly, an additional component, such as the collar 704, can be slid over the retention wire 108. The exposed end region can be deformed, e.g., by wire forming the end region into a wire ring 602, or by staking the end region to form the protrusion 702. The stop 114 can be formed to retain the anchor 110 and/or the collar 704 on the retention wire 108. In either of the assembly procedures described above, the anchor 110 can be installed on the retention wire 108 quickly and easily. Accordingly, the heatsink retainer assembly 100 provides a flexible, low-cost design, having no loose parts, which can hold the heatsink 102 on the carrier substrate 106.

In an embodiment a method of installing and retaining a heatsink 102 on a PCB is provided. In an operation, the heatsink 102 is mounted on a top face of the heat source 104. In an operation, a straight intermediate portion of the retention wire 108 can be inserted between a pair of fins of the heatsink 102. In an operation, a first anchor 110 mounted on the retention wire 108 near the first stop 114a can be slid over the wire to align with a first hole 112 in the carrier substrate 106. The distal end 308 of the first anchor 110 can be inserted into the first hole 112 on the top side of the carrier substrate 106, and the assembler can press on the flattened head portion 306. The barbs 402 can deflect inward to advance through the first hole 112 until the barbs 402 clear the carrier substrate thickness and resiliently return to a widened configuration on the bottom side of the carrier substrate 106. The first anchor 110 can therefore clip into the carrier substrate 106 to retain the retention wire 108 near the first stop 114a relative to the carrier substrate 106. In an operation, the anchoring procedure described above can be performed for a second anchor 110 mounted on the retention wire 108 near the second stop 114b. The second anchor 110 can therefore retain the retention wire 108 near the second stop 114b relative to the carrier substrate 106. With both ends of the retention wire 108 retained relative to the carrier substrate 106, the intermediate portion of the retention wire 108 between the pair of fins can be placed in tension and pulled downward against a top surface of the heatsink 102. Accordingly, the heatsink 102 can be secured against the heat source 104 by the heatsink retainer assembly 100 to effectively remove heat generated by the heat source 104 during operation.

The heatsink anchor 110 described above is one of several possible anchor designs having the body channel 204 to receive the retention wire 108 of the heatsink retainer assembly 100. Other anchor embodiments are contemplated. For example, as described below, lockable anchors may be used to resist dislodgment of the anchor 110 from the carrier substrate 106 and to securely fasten the retention wire 108 and the heatsink 102 to the carrier substrate 106.

Figure 8:
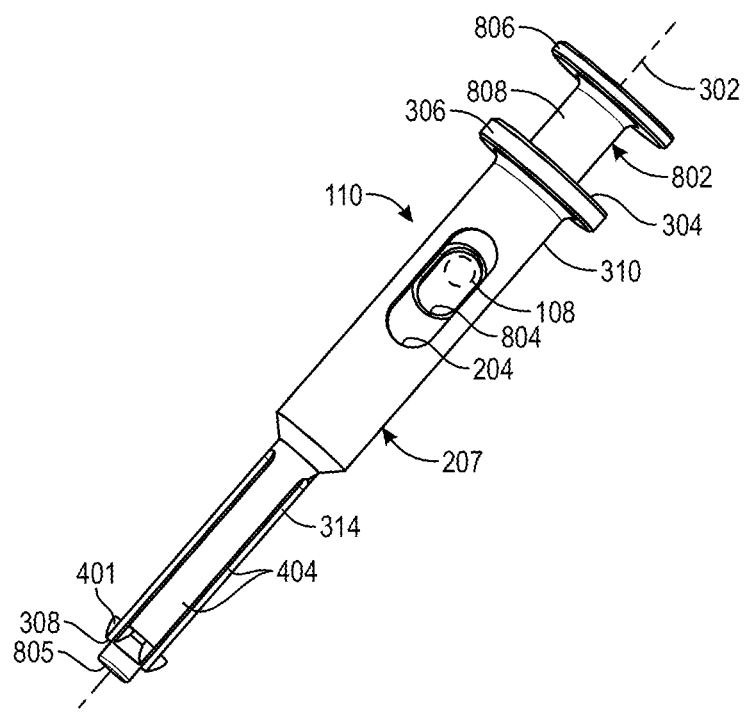
FIG. 8 is a perspective view of a heatsink anchor, in accordance with an embodiment.

Referring to FIG. 8, a perspective view of a heatsink anchor is shown in accordance with an embodiment. The anchor 110 can be a two-part anchor having the body 207 and a plunger 802 disposed within the body 207. The body 207 of the anchor 110 can have features similar or identical to those described above. For example, the body 207 can extend along the body axis 302 from the proximal end 304 to the distal end 308. The body 207 can include the head portion 306, the barrel portion 310, and the pin portion 314 having the characteristics described above. The body channel 204 can extend in the transverse direction through the barrel portion 310 to receive the retention wire 108 (shown in phantom), and the pin portion 314 can be slotted to form prongs 404 terminating in the retention features 401 at the distal end 308. Accordingly, the body 207 can be inserted through a hole 112 in the carrier substrate 106 such that the retention features 401 secure the anchor 110 within the hole 112. In an aspect, however, the anchor 110 further includes a plunger 802 that can be installed and actuated within the body 207 to transition the anchor 110 between an unlocked state (FIG. 9) and an unlocked state (FIG. 10). More particularly, the plunger 802 can resist collapse of the retention features 401 to prevent dislodgment and backout of the anchor 110 from the carrier substrate 106.

In an embodiment, the plunger 802 can be installed within the body 207 such that a plunger channel 804 of the plunger 802 is aligned with the body channel 204 of the body 207. The plunger channel 804 can extend through the plunger 802 transverse to the anchor axis 302. Accordingly, the retention wire 108 may extend through both the body channel 204 and the plunger channel 804 of the anchor 110. The plunger 802 can move in an axial direction along the anchor axis 302 such that a plunger tip 805 of the plunger 802 advances distally (to the unlocked state) or retracts proximally (to the locked state). As described below, in the unlocked state, the plunger tip 805 may not resist radial collapse of the retention features 401, and thus, the retention features 401 may have less resistance to being pulled out from a hole 112 in the carrier substrate 106. By contrast, in the locked state, the plunger tip 805 may resist radial collapse of the retention features 401, and thus, the retention features 401 may be more resistant to being pulled out from the hole 112 in the carrier substrate 106. Axial movement of the plunger 802 within the body 207 between the unlocked state and the locked state can be controlled by external forces applied to the plunger 802 by a user and/or by the retention wire 108.

In an embodiment, actuation of the plunger 802 to the unlocked state is caused by a user pressing distally on the plunger 802. The plunger 802 may include a plunger head 806 at a proximal end 304. The plunger head 806 can have characteristics similar to the head portion 306 of the body 207. For example, the plunger head 806 can be cylindrical. Similarly, a plunger barrel 808 can have characteristics similar to the barrel portion 310 of the body 207. For example, the barrel portion 310 can be cylindrical. In an embodiment, the plunger head 806 is wider than the plunger barrel 808. Accordingly, like the head portion 306 of the solid body 207 described with respect to FIGS. 3-5, the plunger head 806 can provide a larger surface area for the user to press down upon to actuate the plunger 802 toward the distalmost unlocked state. When the plunger 802 is moved to the unlocked state, the plunger tip 805 may not resist radial collapse of the prongs 404 or the retention features 401.

In an embodiment, actuation of the plunger 802 to the locked state may be caused by a return force applied by the retention wire 108 on the plunger 802. It will be appreciated that, when the retention wire 108 is stretched across the heatsink 102 and the wire ends are pushed downward by the anchor 110 toward the carrier substrate 106, the wire is placed in tension and/or deformed, e.g., bent. Internal resilience of the tensioned/deformed retention wire 108 urges the wire ends in an upward direction. The upward force of the retention wire 108 is resisted by the anchor 110, which is secured to the carrier substrate 106 by the retention features 401. Moreover, when the retention wire 108 extends through both the body 207 of the anchor 110 and the internal plunger 802, the upward force can be applied to one or more of the body 207 or the plunger 802. The upward force can move the plunger 802 within and relative to the body 207 to the locked state at which the plunger tip 805 resists radial collapse of the prongs 404 or the retention features 401.

Figure 9:
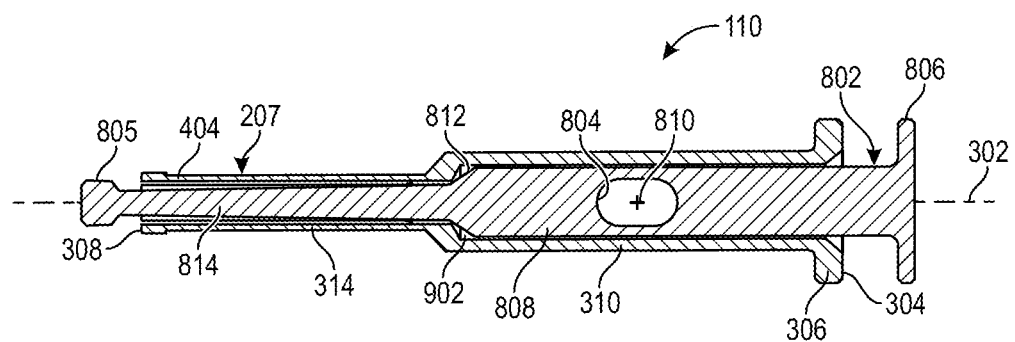
FIG. 9 is a cross-sectional view of a heatsink anchor in an unlocked state, in accordance with an embodiment.
Figure 10:
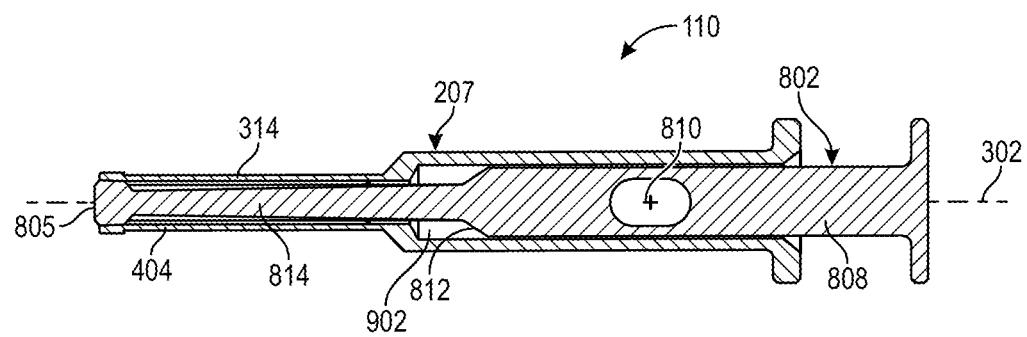
FIG. 10 is a cross-sectional view of a heatsink anchor in a locked state, in accordance with an embodiment.

Referring to FIG. 9, a cross-sectional view of a heatsink anchor in an unlocked state is shown in accordance with an embodiment. The anchor 110 may include a body cavity 902 extending along the anchor axis 302 through the head portion 306, the barrel portion 310, and the pin portion 314. More particularly, the body cavity 902 can be a longitudinal channel extending from the proximal end 304 of the body 207 to the distal end 308 of the body 207. Accordingly, the two-part anchor embodiments of FIGS. 8-18 may be contrasted with the single-part anchor embodiments of FIGS. 3-5 at least in that the barrel portion 310 of the body 207 may be hollow. The barrel portion 310 can be tubular to receive the plunger 802, and more particularly, the plunger barrel 808. Accordingly, the plunger 802 can extend along the anchor axis 302 within the body cavity 902.

In an embodiment, the plunger channel 804 can have a hole shape that is circular, rectangular, oval (as shown), or any other shape. In an embodiment, a height of the plunger channel 804 (in the longitudinal direction of the anchor 110) can be greater than a width of the plunger channel 804 (in a direction orthogonal to the longitudinal direction) to allow the retention wire 108 to tilt in an upward or downward direction within the plunger channel 804. The retention wire 108 can extend through the plunger channel 804 of the anchor 110 along the wire axis 202 parallel to a plunger channel axis 810, or at a range of angles relative to the plunger channel axis 810. Accordingly, the plunger 802 can be mounted on the retention wire 108, e.g., between the first stop 114a and the second stop 114b. The plunger 802, and thus the anchor 110, can be slidable along the wire axis 202 relative to the retention wire 108. Accordingly, the anchor 110 can be slid over the retention wire 108 during installation to align the anchor 110 with the hole 112 in the carrier substrate 106.

The plunger barrel 808 can extend from the plunger head 806 to a transition surface 812. The transition surface 812 can be a tapered surface at which the plunger diameter reduces from the plunger barrel 808 to a plunger shaft 814. In the unlocked state, e.g., when the user has pressed the plunger head 806 fully forward toward the head portion 306 of the body 207, transition surface 812 can bottom out on the barrel portion 310. More particularly, the transition surface 812 can contact and be stopped by a distal end of the body cavity 902. In such a state, a proximal end of the plunger channel 804 can be distal to a proximal end of the body channel 204, as shown in FIG. 8. Moreover, the plunger tip 805 may be located distal to the distal end 308 of the pin portion 314 in the unlocked state. In such a state, a radial gap may be located between one or more of the prongs 404 and the plunger shaft 814, and thus, the prongs 404 may deflect radially inward to collapse when the user retrieves the anchor 110 from the carrier substrate 106.

Referring to FIG. 10, a cross-sectional view of a heatsink anchor in a locked state is shown in accordance with an embodiment. When the plunger 802 transitions to the locked state, e.g., when the retention wire 108 presses upward against the plunger 802 and moves the plunger barrel 808 proximally within the body cavity 902, the plunger tip 805 may retract proximally into the pin portion 314. As described below, the plunger tip 805 may be shaped to ensure that the prongs 404 press outward against the carrier substrate 106 when the plunger tip 805 is retracted to the locked state. Accordingly, the retention wire 108 can provide the function of a return spring that moves the plunger 802 relative to the body 207 to lock the anchor 110 within the carrier substrate 106.

In an embodiment, the proximal end of the body channel 204 acts as a positive stop that resists the upward force of the retention wire 108. More particularly, when the retention features 401 are locked into place below the carrier substrate 106, e.g., when the retention wire 108 urges the plunger 802 upward within the body 207, the retention wire 108 may come into contact with the proximal edge of the body channel 204. The proximal edge can apply a reaction force to the retention wire 108 and tension can be generated within the body 207 between the proximal edge and the retention feature 401. Thus, the anchor 110 can restrain the retention wire 108 to cause the retention wire 108 to press downward on the heatsink 102.

Figure 11:
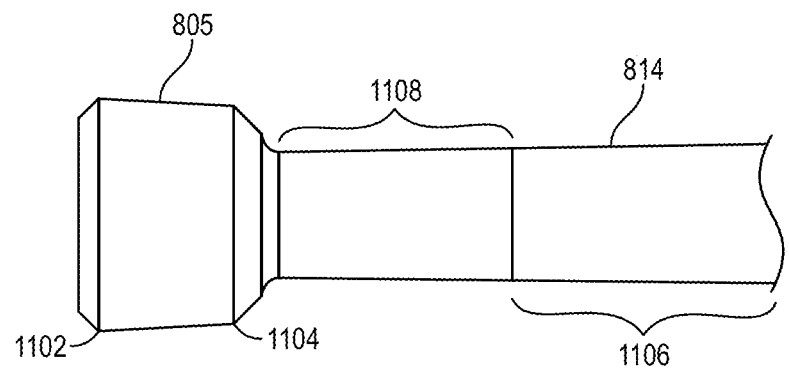
FIG. 11 is a detail view of a distal portion of a plunger of a heatsink anchor, in accordance with an embodiment.

Referring to FIG. 11, a detail view of a distal portion of a plunger of a heatsink anchor is shown in accordance with an embodiment. One or more of the plunger tip 805 or the plunger shaft 814 can be tapered. For example, the plunger tip 805 may have an outer surface that tapers proximally from a distal tip end 1102 to a proximal tip end 1104. More particularly, an outer dimension, e.g., a diameter, of the plunger tip 805 can be greater at the distal tip end 1102 than at the proximal tip end 1104. The taper of the plunger tip 805 provides a surface over which an interior of the prongs 404 can slide when the plunger 802 is moved from the unlocked state to the locked state. As described below, the tapering surface provides self-adjustment of the prongs 404 to ensure that the retention features 401 seat securely against the carrier substrate 106, and can also act as a stop to limit upward movement of the plunger 802, similar to the proximal edge of the body channel 204 in some embodiments. It will be appreciated that the tapered plunger tip 805 can be incorporated in any of the plungers 802 described herein. More particularly, although not shown in FIGS. 13-18, the plunger tip 805 of those embodiments may include an outer surface that tapers proximally to wedge against the prongs 404 of the anchor body 207.

In an embodiment, the plunger shaft 814 tapers distally over a portion of the length between the transition surface 812 (not shown) and the plunger tip 805. More particularly, the plunger shaft 814 can include a tapered section 1106, and optionally, a cylindrical section 1108 that has no taper. The cylindrical section 1108 can have a uniform dimension, e.g., a diameter between the tapered section 1106 and the plunger tip 805. The tapered section 1106 of the plunger shaft 814 can be frustoconical, and accordingly, may have a larger dimension at a proximal end that at a distal end. The dimension over the tapered section 1106 between the transition surface 812 and the distal tip 805 provides a stiffness transition that resists transverse deflection of the plunger shaft 814 under side loads.

Figure 12:
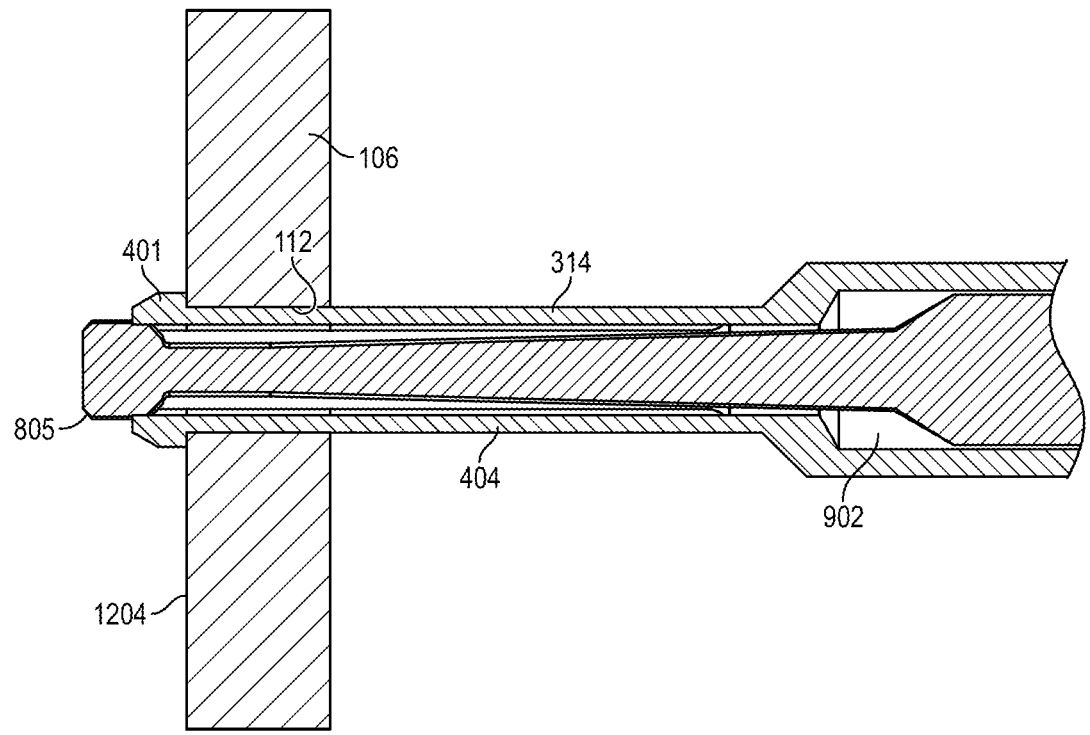
FIG. 12 is a cross-sectional view of a heatsink anchor secured to a carrier substrate, in accordance with an embodiment.

Referring to FIG. 12, a cross-sectional view of a heatsink anchor secured to a carrier substrate is shown in accordance with an embodiment. When the plunger tip 805 is retracted into an interior of the pin portion 314, a distal edge of the retention features 401 can slide over the tapered outer surface of the tip. The retention features 401 are therefore forced radially outward. When the pin portion 314 is inserted through a substrate hole 112 of the carrier substrate 106, the prongs 404 of the pin portion 314 can press against the carrier substrate 106, thereby increasing friction and securing the anchor 110 within the substrate hole 112. It will be appreciated that a tolerance of the substrate hole 112 may be relatively large, e.g., 10-20% of the nominal hole dimension. In the case of an oversized hole, the prongs may not engage the hole and could dislodge from the carrier substrate 106. The tapered plunger tip 805 can, however, provide the advantage of forcing the prongs 404 outward to engage the carrier substrate 106 even in the case of the oversized hole. More particularly, the plunger tip 805 is a self-adjusting feature that urges the prongs 404 outward to engage the hole 112 and provides a quality lock between the anchor 110 and the carrier substrate 106.

In addition to forcing the prongs 404 outward against the carrier substrate 106, retraction of the tapered plunger tip 805 into the pin portion 314 can force the retention features 401, e.g., barbs 402, radially outward to grip a bottom face 1204 of the carrier substrate 106. Similar to forcing the lateral surfaces of the prongs 404 against the carrier substrate 106, when the barbs 402 are forced outward, the barbs 402 can grip the bottom face 1204 to lock the anchor 110 into place within the carrier substrate 106.

In an embodiment, the tapered plunger tip 805 may act as a stop to limit upward movement of the plunger 802 within the body 207. The plunger tip 805 can limit the upward movement because, when the prongs 404 are forced outward against the carrier substrate 106, an internal dimension of the pin portion 314 can be limited. When the internal dimension is less than an outer dimension of the plunger tip 805 at the distal tip end 1102, further retraction of the plunger 802 is disallowed. Thus, in an embodiment, the pin portion 314 is locked in place and the plunger movement is constrained in the locked state regardless of whether the retention wire 108 is forced upward against the proximal edge of the body channel 204.

Figure 13:
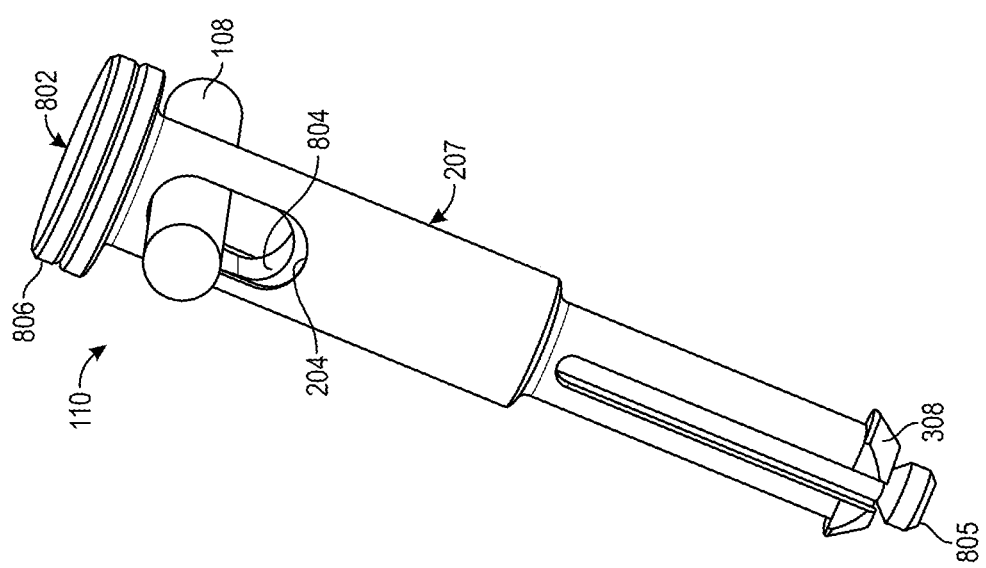
FIG. 13 is a perspective view of a heatsink anchor in an unlocked state, in accordance with an embodiment.

Referring to FIG. 13, a perspective view of a heatsink anchor in an unlocked state is shown in accordance with an embodiment. In an alternative two-part anchor embodiment, the plunger 802 can be coaxially located with the body 207, as described above. The plunger 802 and the body 207 can have features similar to those described above, including a body channel 204 and the plunger channel 804, which are configured to receive the retention wire 108. Description of the features is not repeated here in the interest of brevity. Also as described above, the anchor 110 can be transitioned to the locked state by pressing downward on the plunger head 806 to drive the plunger tip 805 distal to the distal end 308 of the body 207.

Figure 14:
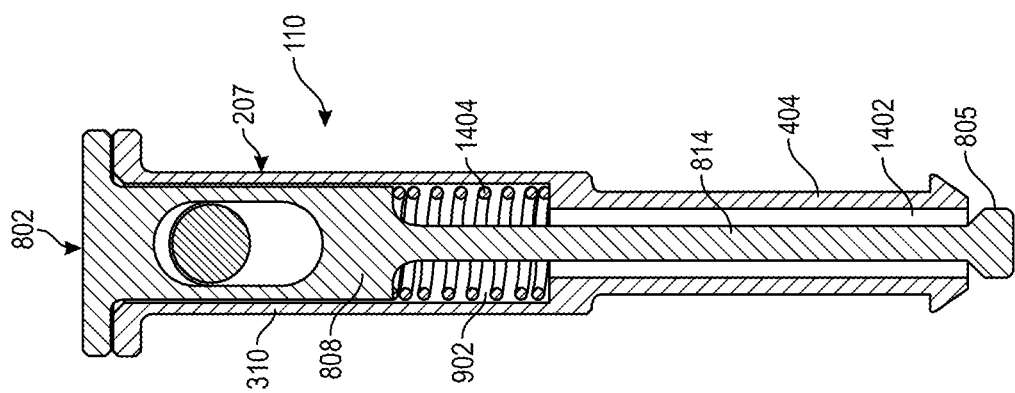
FIG. 14 is a cross-sectional view of a heatsink anchor in an unlocked state, in accordance with an embodiment.

Referring to FIG. 14, a cross-sectional view of a heatsink anchor in an unlocked state is shown in accordance with an embodiment. In the unlocked state, a radial gap 1402 may be located between the prongs 404 of the pin portion 314 and the plunger shaft 814. For example, an outer surface of the plunger shaft 814 can be cylindrical and have an outer diameter that is smaller than an inner diameter of the pin portion 314. Accordingly, when the plunger tip 805 is not located within the pin portion 314, the prongs 404 may collapse radially to allow the anchor 110 to be dislodged and/or retrieved from the carrier substrate 106.

The user can transition the anchor 110 to the unlocked state by forcing the plunger 802 against a biasing element. The biasing element can be an integral spring component that provides a return force, similar to the function of the retention wire 108 in the embodiment of FIGS. 8-10. For example, the anchor 110 may include a return spring 1404 that is disposed between the plunger 802 and the body 207.

The return spring 1404 can be a spring having ends that are in contact with both the plunger 802 and the body 207. For example, the return spring 1404 may be a compression spring having a first end in contact with a distal end of the barrel portion 310 and a second end in contact with a distal end of the plunger barrel 808. Alternatively, the spring may be a tension spring having a first end attached to the plunger barrel 808 at a location distal to a second end attached to the barrel portion 310. When the user depresses the plunger 802, as shown in FIGS. 13-14, the return spring 1404 can deflect. Accordingly, the return spring 1404 can exert a biasing force on the plunger 802 to urge the plunger 802 proximally against the user-applied force.

Figure 16:
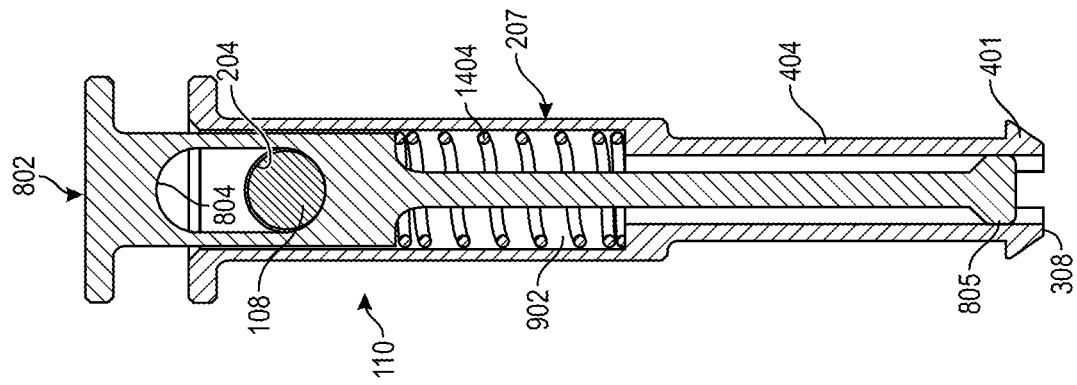
FIG. 16 is a cross-sectional view of a heatsink anchor in a locked state, in accordance with an embodiment.
Figure 15:
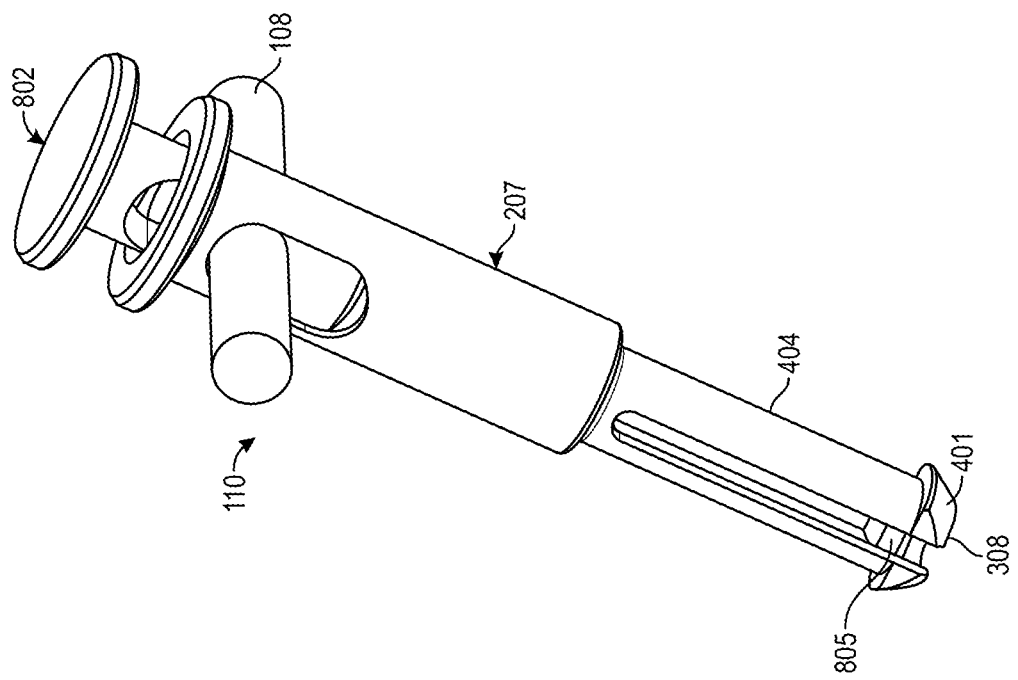
FIG. 15 is a perspective view of a heatsink anchor in a locked state, in accordance with an embodiment.

Referring to FIG. 15, a perspective view of a heatsink anchor in a locked state is shown in accordance with an embodiment. When the user releases the plunger 802, the return spring 1404 can move the plunger 802 proximally relative to the body 207 from the unlocked state (FIGS. 13-14) to the locked state (FIGS. 15-16). The plunger tip 805 can retract into the interior space between the retention features 401 and/or prongs 404 of the body 207. Accordingly, radial collapse of the prongs 404 and/or the barbs 402 is impeded by the plunger tip 805 and thus the anchor 110 is locked into place within the carrier substrate 106

Referring to FIG. 16, a cross-sectional view of a heatsink anchor in a locked state is shown in accordance with an embodiment. When the return spring 1404 urges the plunger 802 upward within the body 207, the retention wire 108 may be sandwiched between the distal end of the plunger slot 804 and a proximal end of the body slot 204. Further movement of the plunger 802 is therefore resisted by the retention wire 108 that extends through the body 207 and the plunger 802. Accordingly, the retention wire 108 can resist dislodgment of the plunger 802 from the body 207 when the anchor 110 is locked in place within the carrier substrate 106. In the locked state, the return spring 1404 may remain in a deflected state, e.g., under some tension or compression. Accordingly, the anchor structure can be stabilized in the locked state.

A method of assembling the heatsink retainer assembly 100 having the two-part anchor may be similar to the method of assembling the heatsink retainer assembly 100 having the one-part anchor, as described above. In an operation, the anchor 110 is inserted onto an end of the retention wire 108 and slid over the straight intermediate portion of the retention wire 108. More particularly, the plunger channel 804 and the body channel 204 can be aligned to allow the body 207 and the plunger 802 to be inserted over the retention wire 108. In the case of the retention wire 108 having a wire ring 602, the loop 604 of the wire ring 602 can be inserted into the body channel 204 and the plunger channel 804, and the anchor 110 can be slid over the wire ring 602 until it is placed over the elongated body 203 of the retention wire 108. As described above, the anchor 110 can be slid onto the elongated body 203 prior to or after forming the stop 114 on the retention wire 108.

In an embodiment a method of installing and retaining a heatsink 102 on a PCB is provided. In an operation, the heatsink 102 is mounted on a top face of the heat source 104. In an operation, a straight intermediate portion of the retention wire 108 can be inserted between a pair of fins of the heatsink 102.

In an operation, the anchor 110 is transitioned to the unlocked state. For example, the user can depress the plunger 802 to move the plunger tip 805 distal to the distal end 308 of the body 207. Depressing the plunger 802 may compress the return spring 1404 in some embodiments. In the unlocked state, the body 207 of the anchor 110 is inserted through the substrate hole 112 of the carrier substrate 106. The plunger tip 805 does not impede radial collapse of the prongs 404, and thus, the outer dimension of the pin portion 314 can reduce as the anchor 110 is advanced through the carrier substrate 106.

The anchor 110 can be installed into the carrier substrate 106 from a top side of the components. More particularly, the anchor 110 can be pressed downward through the carrier substrate 106 such that locking anchor extends from the proximal end 304 of the body 207 above the heatsink 102 to the distal end 308 of the body 207 below the carrier substrate 106. It will be appreciated that installation and removal of the anchor 110 from a top side of the carrier substrate 106 (or a same side as heat source 104) is advantageous for the reasons provided above.

In an operation, the user releases the plunger 802 to allow the anchor 110 to transition from the unlocked state to the locked state. For example, the upward force from the deformed retention wire 108 and/or the return spring 1404 can drive the plunger 802 upward within the body 207 to retract the plunger tip 805 into the body cavity 902 of the body 207. Accordingly, in the locked state, the plunger tip 805 can prevent radial collapse of the prongs 404. Moreover, the plunger tip 805 can actually deflect the prongs 404 and/or retention features 401 radially outward, as described above, to secure the anchor 110 within the carrier substrate 106 and increase an amount of force that is required to dislodge the anchor 110 from the carrier substrate 106. More particularly, in the locked state, the anchor 110 resists inadvertent backout of the anchor 110 from the substrate hole 112.

The method of installing the anchor 110 described above may be for a first two-part anchor 110. A second two-part anchor 110 may be similarly mounted on the retention wire 108 and installed in the carrier substrate 106 through another substrate hole 112. The second anchor 110 may be mounted on the retention wire 108 near the second stop 114b. The second anchor 110 can therefore retain the retention wire 108 near the second stop 114b relative to the carrier substrate 106. With both ends of the retention wire 108 retained relative to the carrier substrate 106, the intermediate portion of the retention wire 108 between the pair of fins can be placed in tension and pulled downward against a top surface of the heatsink 102. Accordingly, the heatsink 102 can be secured against the heat source 104 by the heatsink retainer assembly 100 to effectively remove heat generated by the heat source 104 during operation.

The anchor 110, the retention wire 108, or any other component described above, such as the body 207 and the plunger 802, may be fabricated from any of a variety of suitable materials. For example, the anchor and the anchor subcomponents may be machined from brass, stainless steel, etc., or injection molded from a suitable polymer. Similarly, the plunger 802 may be machined from brass, stainless steel, etc., or injection molded from a suitable polymer. These material options are provided by way of example only, and it will be appreciated that the structures described herein may be fabricated using any known material and/or manufacturing technique.

The one- and two-part anchors 110 described above may be used in conjunction with the retention wire 108 to restrain the heatsink 102 of the heatsink assembly 101. In certain applications, however, anchors 110 are provided that can retain the heatsink 102 without the use of the retention wire 108. Heatsink retainers that directly couple the heatsink 102 to the carrier substrate 106 may be referred to as push pins.

Accordingly, in an embodiment, the heatsink anchor 110 is a locking push pin as described below.

Figure 17:
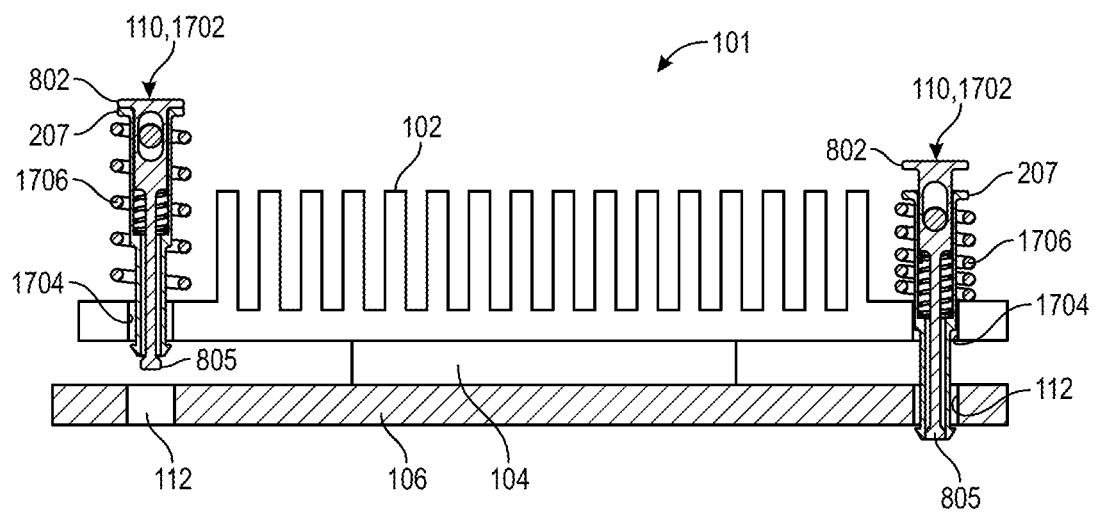
FIG. 17 is a cross-sectional view of a heatsink being retained against a heat source by locking push pins, in accordance with an embodiment.

Referring to FIG. 17, a cross-sectional view of a heatsink being retained against a heat source by locking push pins is shown in accordance with an embodiment. The heatsink assembly 101 includes the heat source 104. The heat source 104 can be an electronic component mounted on the carrier substrate 106. For example, the heat source 104 can be an active electronic component such as an integrated circuit. Alternatively, the heat source 104 can be any type of device dissipating power during its operation, including light sources, electrical solenoids, electric motors, and passive electronic components, as well as other devices commonly known or yet to be conceived. The carrier substrate 106 has one or more substrate holes 112, which may extend through a thickness of the carrier substrate 106. The substrate holes 112 may be sized and located to receive fastening hardware, such as one or more anchors 110, e.g., locking push pins 1702.

The locking push pins 1702 can hold the heatsink 102, or another heat exchange device, against the heat source 104. More particularly, the heatsink 102 can be mounted on the heat source 104, e.g., in direct contact with the heat source 104. The heatsink 102 may be thermally coupled to the heat source 104 by a thermal interface material disposed between the heat source 104 and the heatsink 102. The heatsink 102 can include one or more heatsink holes 1704 sized and located to receive fastening hardware, such as the locking push pins 1702.

In an embodiment, the locking push pin 1702 is inserted through one or more of the heatsink 102, e.g., through the heatsink holes 1704, or the carrier substrate 106, e.g., through the substrate hole 112. For example, the leftmost locking push pin 1702 in FIG. 17 is inserted through the heatsink holes 1704, and the rightmost locking push pin 1702 in FIG. 17 is inserted through both the heatsink holes 1704 and the substrate hole 112. The leftmost locking push pin 1702 is in an unlocked configuration. This is evident from the extended position of the plunger tip 805 and the lesser separation between the body 207 and the plunger 802. By contrast, the rightmost locking push pin 1702 is in a locked configuration. This is evident from the retracted position of the plunger tip 805 and the greater separation between the body 207 and the plunger 802. The locking push pin 1702 can be advanced through the holes in the unlocked state, and the locking push pin 1702 can be locked to resist retraction through the holes in the locked state.

The heatsink assembly 101 can include a compression spring 1706 mounted on the body 207. When the locking push pin 1702 is inserted through the heatsink 102 and the carrier substrate 106, the compression spring 1706 can be sandwiched between the body 207 and an upper surface of the heatsink 102. Accordingly, the compression spring 1706 can press on the heatsink 102 to hold the heatsink 102 against the heat source 104. The compression spring 1706 can generate an axial load within the body 207 between an upper portion of the body 207 above the carrier substrate 106 and a lower portion of the body 207 below the carrier substrate 106. More particularly, the biasing force of the compression spring 1706 can pull the lower portion of the body 207 against the carrier substrate 106. Accordingly, the locking push pin 1702 and compression spring 1706 can securely fasten the heatsink 102 to the carrier substrate 106 and the heat source 104 to facilitate heat transfer between those components.

Figure 18:
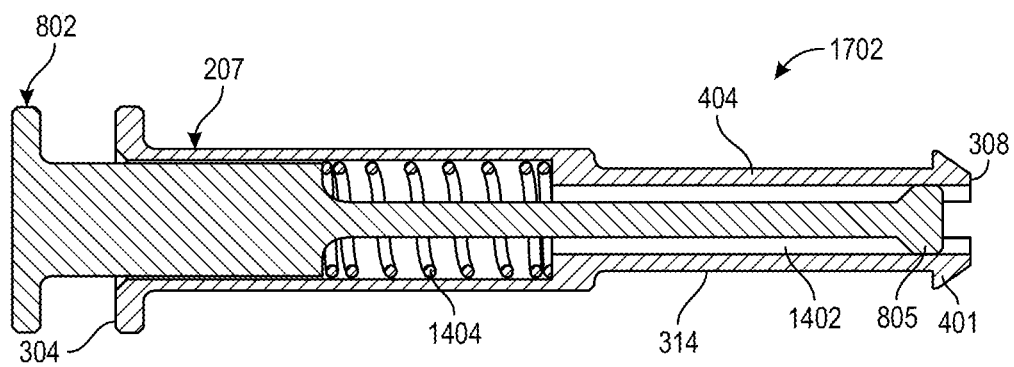
FIG. 18 is a cross-sectional view of a locking push pin, in accordance with an embodiment.

Referring to FIG. 18, a cross-sectional view of a locking push pin is shown in accordance with an embodiment. The locking push pin 1702 may have a structure similar to that of the two-part anchor 110 described with respect to FIGS. 15-18, with the exception that one or more of the body 207 or the plunger 802 may not have a respective transverse channel. More particularly, the body 207 of the locking push pin 1702 may lack the body channel 204, and the plunger 802 of the locking push pin 1702 may lack the plunger channel 804. Other features, such as the return spring 1404, the plunger tip 805, the retention features 401, etc. may be similar or identical to corresponding anchor features described above.

Like the two-part anchor 110 described above, the plunger 802 of the locking push pin 1702 can be depressed to transition the push pin to the unlocked state in which the plunger tip 805 is located distal to the distal end 308 of the body 207. The return spring 1404 can bias the plunger 802 in the proximal direction to urge the plunger tip 805 into the interior of the pin portion 314, and thus lock the retention features 401 below the carrier substrate 106.

As with the other methods described above, a method of installing the locking push pin 1702 to secure the heatsink 102 and the carrier substrate 106 can be accomplished with simple or no installation tools. In an operation, the locking push pin 1702 is transitioned to the unlocked state. For example, the user can depress the plunger 802 to compress the return spring 1404 and move the plunger tip 805 distal to the distal end 308 of the body 207. In the unlocked state, the body 207 of the locking push pin 1702 is inserted through the heatsink 102 and the carrier substrate 106. The heatsink 102 can be mounted on the heat source 104 carried by the carrier substrate 106. Furthermore, prior to and/or in preparation for the operation, the compression spring 1706 can be located between the head portion 306 and the heatsink 102 to provide a downward force on the heatsink 102 when the locking push pin 1702 has secured the heatsink 102 to the carrier substrate 106.

In the unlocked state, the pin portion 314 of the anchor 110 can be inserted through the heatsink holes 1704 and the substrate hole 112. The locking push pin 1702 can be installed into the heatsink 102 and the carrier substrate 106 from a top side of the components (or a same side as heat source 104). More particularly, the locking push pin 1702 can be pressed downward through the components such that locking push pin 1702 extends from the proximal end 304 of the body 207 above the heatsink 102 to the distal end 308 of the body 207 below the carrier substrate 106. The radial gap 1402 can allow the prongs 404 to collapse inward to allow the retention features 401 to pass through the carrier substrate 106.

In an operation, the user releases the plunger 802 to allow the return spring 1404 to bias the locking push pin 1702 to the locked state. In the locked state, the plunger tip 805 can retract into the body cavity 902 of the body 207, and thus, can prevent radial collapse of the prongs 404. Moreover, the plunger tip 805 can actually deflect the prongs 404 and/or retention features 401 radially outward, as described above, to secure the anchor 110 within the carrier substrate 106 and increase an amount of force that is required to dislodge the anchor 110 from the carrier substrate 106. More particularly, in the locked state, the anchor 110 resists inadvertent back-out of the anchor 110 from the substrate hole 112, and thus, couples the heatsink 102 to the carrier substrate 106. Accordingly, the heatsink 102 can be secured against the heat source 104 by the locking push pins 1702 to effectively remove heat generated by the heat source 104 during operation.

It will be appreciated that the tapered section 805 shown in FIG. 18 may have a taper similar to that shown in FIG. 11. As such, the tapered section 805 may be arranged to wedge into the radial gap 1402, as described above with respect to FIG. 12. More particularly, when the user releases the plunger 802, the tapered section 805 of the locking push pin 1702 can engage the prongs 404 and limit upward movement of the plunger 802. Accordingly, the plunger 802 can be restrained to reduce the likelihood that the plunger 802 will withdraw from the body 207 when the locking push pin 1702 is installed in the carrier substrate 106.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A heatsink retainer assembly, comprising:
a retention wire extending along a wire axis between a first wire end and a second wire end; and
an anchor including a body having a barrel portion and a pin portion extending along an anchor axis, wherein the body has a body channel including a hole extending through the barrel portion transverse to the anchor axis, and wherein the retention wire extends through the hole in the barrel portion such that the anchor is mounted on the retention wire between the first wire end and the second wire end.

2. The heatsink retainer assembly of claim 1, wherein the anchor is slidable along the retention wire.

3. The heatsink retainer assembly of claim 1, wherein the barrel portion is wider than the pin portion.

4. The heatsink retainer assembly of claim 3, wherein the pin portion extends from the barrel portion to a distal end of the body, and wherein the anchor includes one or more retention features at the distal end.

5. The heatsink retainer assembly of claim 4, wherein the pin portion includes a plurality of prongs extending to the distal end, and wherein each prong has a respective one or more retention features.

6. The heatsink retainer assembly of claim 5, wherein the anchor includes a body cavity extending along the anchor axis through the barrel portion and the pin portion from a proximal end of the body to the distal end of the body, and wherein a plunger extends along the anchor axis within the body cavity.

7. The heatsink retainer assembly of claim 6, wherein the plunger includes a plunger channel extending through the plunger transverse to the anchor axis, and wherein the retention wire extends through the plunger channel.

8. The heatsink retainer assembly of claim 7, wherein the anchor includes a return spring between the plunger and the body to bias the plunger from an unlocked state to a locked state.

9. The heatsink retainer assembly of claim 1, wherein the retention wire includes a first stop disposed at the first wire end and a second stop disposed at the second wire end, and wherein the first stop and the second stop are wider than the body channel.

10. The heatsink retainer assembly of claim 9, wherein one or more of the first stop or the second stop include a wire ring extending from the retention wire and having a loop.

11. The retention wire of claim 10, wherein the loop extends over the retention wire such that a stop surface of the loop blocks the anchor from sliding onto the loop.

12. The heatsink retainer assembly of claim 9, wherein one or more of the first stop or the second stop include a protrusion extending radially outward from the wire axis.

13. A heatsink anchor, comprising:
a body including a barrel portion and a pin portion extending along an anchor axis to a distal end of the body, wherein the barrel portion is wider than the pin portion, and wherein a body channel extends through the barrel portion transverse to the anchor axis, and wherein the pin portion includes a plurality of prongs distal to the barrel portion and separated by a slot extending along the anchor axis through the distal end of the body such that, when the heatsink anchor is inserted through a hole in a carrier substrate, the distal end of the body is on an opposite side of the carrier substrate as a heat exchange device, and the body channel is on a same side of the carrier substrate as the heat exchange device to receive a retention wire to hold the heat exchange device on the carrier substrate.

14. The heatsink anchor of claim 13, wherein each prong has a respective retention feature at the distal end.

15. The heatsink anchor of claim 14, wherein a body cavity extends along the anchor axis through the barrel portion and the pin portion from a proximal end of the body to the distal end of the body, and further comprising a plunger extending along the anchor axis within the body cavity.

16. The heatsink anchor of claim 15, wherein the plunger includes a plunger channel extending through the plunger transverse to the anchor axis, and wherein the body channel and the plunger are aligned to receive the retention wire through the body and the plunger.

17. The heatsink anchor of claim 15, wherein the anchor includes a return spring between the plunger and the body to bias the plunger from an unlocked state to a locked state.

18. A heatsink retention wire, comprising:
an elongated body extending along a wire axis from a first wire end to a second wire end and configured to extend over an upper surface of a heatsink between fins of the heatsink;
a first stop integrally formed with the elongated body at the first wire end, wherein the first stop includes a wire ring having more than one loop extending from the first wire end to a location overlapping the elongated body radially outward from the first wire end such that an anchor can be slid over the wire ring to be retained on the elongated body; and
a second stop disposed at the second wire end;
wherein the first stop and the second stop are wider than the elongated body.

* * * * *